United States Patent
Lin

(10) Patent No.: US 9,412,722 B1
(45) Date of Patent: Aug. 9, 2016

(54) MULTICHIP STACKING PACKAGE STRUCTURE AND METHOD FOR MANUFACTURING THE SAME

(71) Applicant: Dawning Leading Technology Inc., Miao-Li County (TW)

(72) Inventor: Diann-Fang Lin, Miao-Li County (TW)

(73) Assignee: DAWNING LEADING TECHNOLOGY INC. (TW)

( * ) Notice: Subject to any disclaimer, the term of this patent is extended or adjusted under 35 U.S.C. 154(b) by 0 days.

(21) Appl. No.: 14/620,705

(22) Filed: Feb. 12, 2015

(51) Int. Cl.
*H01L 21/44* (2006.01)
*H01L 23/02* (2006.01)
*H01L 25/065* (2006.01)
*H01L 25/00* (2006.01)
*H01L 23/00* (2006.01)

(52) U.S. Cl.
CPC ............ *H01L 25/0657* (2013.01); *H01L 24/30* (2013.01); *H01L 24/49* (2013.01); *H01L 24/73* (2013.01); *H01L 24/83* (2013.01); *H01L 24/85* (2013.01); *H01L 24/92* (2013.01); *H01L 25/50* (2013.01); *H01L 2224/30104* (2013.01); *H01L 2224/49107* (2013.01); *H01L 2224/73215* (2013.01); *H01L 2224/92247* (2013.01); *H01L 2225/0651* (2013.01); *H01L 2225/06506* (2013.01); *H01L 2924/35* (2013.01)

(58) Field of Classification Search
CPC ............ H01L 2224/73265; H01L 2224/48227; H01L 2224/48247; H01L 2224/32145; H01L 25/0657; H01L 2224/48145; H01L 23/49575; H01L 24/85; H01L 2225/0651; H01L 2224/48257; H01L 2224/4911
USPC .......... 438/107, 109, 612, 618; 257/686, 690, 257/693
See application file for complete search history.

(56) References Cited

U.S. PATENT DOCUMENTS

| | | | | |
|---|---|---|---|---|
| 7,163,839 | B2 * | 1/2007 | Yan et al. | H01L 24/49 257/E21.705 |
| 8,242,607 | B2 * | 8/2012 | Chin | H01L 25/0657 257/686 |
| 2013/0093103 | A1 * | 4/2013 | Kim et al. | H01L 25/0657 257/777 |
| 2013/0099393 | A1 * | 4/2013 | Jeong et al. | H01L 25/0657 257/777 |

* cited by examiner

*Primary Examiner* — Hsien Ming Lee
(74) *Attorney, Agent, or Firm* — Bacon & Thomas, PLLC

(57) ABSTRACT

The present invention relates to a multichip stacking package structure and a method for manufacturing the same, wherein the multichip stacking package structure comprises a substrate including a plurality of electrical connecting pad; a first chip with a lower surface stacked on the substrate; a second chip stacked on an upper surface of the first chip by a interlaced reciprocation stacking way; a spacer stacked on an upper surface of the second chip by the interlaced reciprocation stacking way; and third chip stacked on the an upper surface of the spacer by the interlaced reciprocation stacking way, so that a first spacing is formed between an end of the third and an end of the spacer. Thereby, a position of a stress point is changed to reduce a risk of the chip crack during wire bonding.

9 Claims, 3 Drawing Sheets

MULTICHIP STACKING PACKAGE STRUCTURE AND METHOD FOR MANUFACTURING THE SAME

BACKGROUND OF THE INVENTION

1. Field of the Invention

The present invention relates to a semiconductor chip package structure and a method for manufacturing the same, and more particularly to a multichip stacking package structure and a method for manufacturing the same.

2. Description of Related Art

A multichip package (MCP) structure is a package with a plurality of semiconductor chips integrated into a single package structure, so that density of electronic components is enhanced to shorten the electrical connecting paths between electronic components. This package not only reduces the overall size of the multichip but also enhances overall performance.

In conventional multichip package structure, a plurality of chips are stacked vertically, alternately, stepwise or otherwise, and then each of the chips is electrically connected to a substrate through wire bonding. In multi-semiconductor chips stacking package technology, a stacking package technology of multichip with same size is a conventional package technology.

In the known technology, please refer to FIG. 1, FIG. 1 is a sectional schematic diagram of a conventional stacking multichip package structure; wherein a lower surface of a first chip 13 is stacked on a substrate 11, and a lower surface of a second chip 14 is stacked on an upper surface of the first chip 13 by a interlaced reciprocation stacking way; further, a lower surface of a third chip 15 is stacked on the second chip 14 by the interlaced reciprocation stacking way, and a lower surface of a fourth chip 16 is stacked on the upper surface of the third surface by the interlaced reciprocation stacking way. Besides, chip pads on the upper surfaces of each chip are respectively electrically connected to a plurality of electrical connecting pads 12 on the substrate 10 by a plurality of wires. Moreover, these chips are bonded to each other by a die adhesion layer 17. An empty space is formed under the bond pad of the third chip 15; therefore, a support is not enough during wire bonding, so that a problem of chip cracks is generated. Hence, in order to satisfy a stress during wire bonding, a thickness of the third chip 15 should be thickened to avoid damages of chips.

Besides, in the other known technology, such as Taiwan Patent Publication No. 201222737A1, a semiconductor die package is disclosed. An example of the semiconductor package includes a first group of semiconductor die interspersed with a second group of semiconductor die. The die from the first and second groups are offset from each other along a first axis and staggered with respect to each other along a second axis orthogonal to the first axis. A second example of the semiconductor package includes an irregular shaped edge and a wire bond to the substrate from a semiconductor die above the lowermost semiconductor die in the package.

However, as shown in FIG. 1, the stacking multichip package structure 1 should increase the thickness of chips to avoid damages of chips. But, the complexity for preparing materials is increased during increasing the thickness of the chips; therefore, a problem for controlling the thickness of chip to be not easy is generated. Besides, in the other known technology, chips are electrically connected to the substrate by wire bonding, but the chips are cracked easily through wire bonding. Therefore, there is an urgent need for a multichip stacking package structure and a method for manufacturing the same, which provides an optimum support by changing a position of wire bonding, and provides a spacer without wire bonding on it to avoid the chip crack. Further, the present invention provides chips with the same thickness to simplify process of production and control the cost of production.

SUMMARY OF THE INVENTION

An object of the present invention is to provide a stacking multichip package structure, which a interlaced reciprocation stacking way can be used between the chips and the spacers by changing position of wire bonding; therefore, a risk of chip crack during wire bonding can be reduced and achieve each requirement of package subject to more light, more thin, more short, or more small.

To achieve the above object, the present invention provides a multichip stacking package structure, comprising a substrate including a plurality of electrical connecting pads; a first chip including an upper surface with a first chip pad and a lower surface opposite to the upper surface; a second chip including an upper surface with a second chip pad and a lower surface opposite to the upper surface, wherein the lower surface of the second chip can be stacked on the upper surface of the first chip by a interlaced reciprocation stacking way; a spacer including an upper surface and a lower surface opposite to the upper surface, wherein the spacer can be stacked on the upper surface of the second surface by the interlaced reciprocation stacking way; and a third chip including an upper surface with a third chip pad and a lower surface opposite to the upper surface, wherein the third chip can be stacked on the upper surface of the spacer by the interlaced reciprocation stacking way, so that a first spacing can be formed between an end of the third chip and an end of the spacer.

In the multichip stacking package structure of the present invention, the stacking multichip package structure may further comprise a fourth chip, and the fourth chip may comprise an upper surface with a fourth chip pad and a lower surface opposite to the upper surface, wherein the fourth chip can be stacked on the upper surface of the third surface by the interlaced reciprocation stacking way. Besides, in the multichip stacking package structure of the present invention, the end of the fourth chip may be set closely to the third chip pad to provide an optimum support, thereby avoiding the chip crack.

In the multichip stacking package structure of the present invention, the multichip stacking package structure may further comprise a plurality of wires which are used to electrically connected with the first chip pad, the second chip pad, the third chip pad and the fourth chip pad; alternatively, these chip pads are electrically connected to each other by wires to input or output signals. In the multichip stacking package structure of the present invention, the spacer is not connected with the wires; therefore, the spacer won't be crack because of wire bonding.

In the multichip stacking package structure of the present invention, a second spacing may be formed between an end of the fourth chip and an end of the spacer; wherein a distance of the second spacing and a distance of the first spacing may be randomly varied based on the user's requirements. In an aspect of the present invention, the distance of the second spacing may be twice as much as the distance of the first spacing, but the present invention is not limited thereto. In the multichip stacking package structure of the present invention, an numerical value of addition of the distance of the first spacing, the distance of the second spacing and widths of the chips should be less than a length of the substrate to be beneficial to package the multichip stacking package structure.

In the multichip stacking package structure of the present invention, the numbers of the stacked chips and the spacers may be randomly varied based on the user's requirements, in an aspect of the present invention, the number of the stacked chips is 4 and the number of the spacer is 1. Besides, a stacked position of the spacer is preferably between the chips to provide an optimum support; thereby avoiding the chip crack.

In the multichip stacking package structure of the present invention, the first chip, the second chip, the third chip and the fourth chip are bonded to each other by an adhesion layer. Besides, the lower surface of the first chip may be bonded on the substrate by a die adhesion layer, and the adhesion layer or the die adhesion layer of the present invention may be a FOW film (film over wire) or other equivalent materials. In an aspect of the present invention, the die adhesion layer can be the FOW film.

Besides, another object of the present invention is to provide a method for manufacturing multichip stacking package structure, comprising: providing a substrate having a plurality of electrical connecting pads; stacking a first chip on the substrate, wherein the first chip may comprise an upper surface with a first chip pad and a lower surface opposite to the upper surface, and the lower surface of the first chip is stacked on the substrate; stacking a second chip on the first chip, wherein the second chip may comprise an upper surface with a second chip pad and a lower surface opposite to the upper surface, and the lower surface of the second chip may be stacked on the upper surface of the first chip by a interlaced reciprocation stacking way; stacking a spacer on the second chip, wherein the spacer may comprise an upper surface and a lower surface opposite to the upper surface, and the spacer is stacked on the upper surface of the second chip by the interlaced reciprocation stacking way; and stacking a third chip on the spacer, wherein the third chip may comprise an upper surface with a third chip pad and a lower surface opposite to the upper surface, and the lower surface of the third chip is stacked on the upper surface of the spacer, so that a first spacing is formed between an end of the third chip and an end of the spacer.

In the method for manufacturing multichip stacking package structure, the method may further comprise a step of stacking a fourth chip on the third chip; wherein the fourth chip may comprise an upper surface with a fourth chip pad and a lower surface opposite to the upper surface, and the fourth chip may be stacked on the upper surface of the third chip by the interlaced reciprocation stacking way. In the method for manufacturing multichip stacking package structure, the end of the fourth chip is set closely to the third chip pad provide an optimum support; thereby avoiding the chip crack.

In the method for manufacturing multichip stacking package structure, the method further comprises a step of forming a plurality of wires; wherein the first chip pad, the second chip pad, the third chip pad and the fourth chip pad are electrically connected by these wires; alternatively, these chip pads are electrically connected to each other by wires. In the method for manufacturing multichip stacking package structure, the spacer is not connected with the wires; therefore, the spacer won't be cracked because of wire bonding.

In the method for manufacturing multichip stacking package structure, a second spacing may be formed between an end of the fourth chip and an end of the spacer; wherein a distance of the second spacing and a distance of the first spacing may be randomly varied based on the user's requirements. In an aspect of the present invention, the distance of the second spacing may be twice as much as the distance of the first spacing, but the present invention is not limited thereto.

In the method for manufacturing multichip stacking package structure, the first chip, the second chip, the third chip and the fourth chip may be bonded to each other by a die adhesion layer; besides, the lower surface of the first chip may be bonded on the substrate by the die adhesion layer. The adhesion layer or the die adhesion layer may be a FOW film (film over wire) or other equivalent materials; in an aspect of the present invention, the die adhesion layer may be the FOW film.

Therefore, the effects of the present invention are that the position of wire bonding is changed to provide an optimum support to avoid the chip crack, and chips with the same thickness are provided to simplify production of chips. To sum up, the technical features of the present invention are that at least one spacer is stacked among a plurality of chips; therefore, the present invention may provide an optimum support among these chips, and avoid the chip crack during wire bonding.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Hereinafter, the actions and the effects of the present invention will be explained in more detail via specific examples of the invention. However, these examples are merely illustrative of the present invention and the scope of the invention should not be construed to be defined thereby.

Example 1

Figure 1:
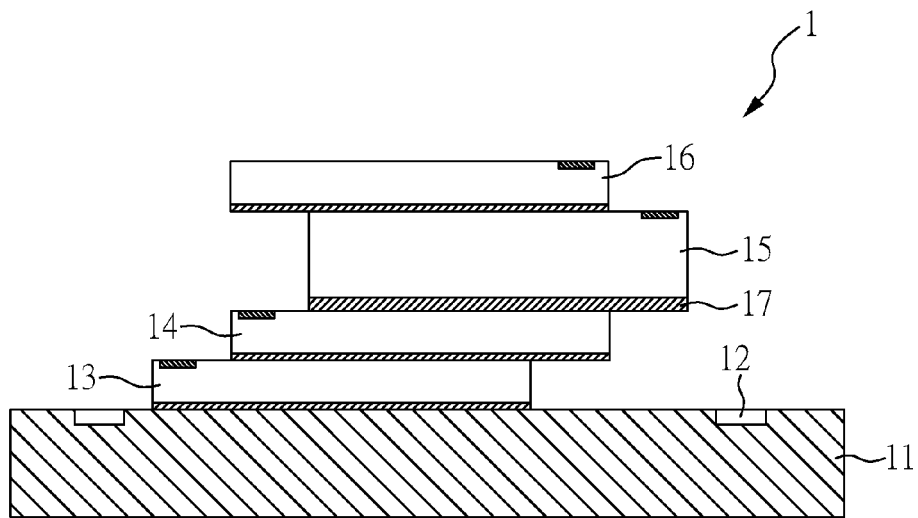
FIG. 1 shows a sectional schematic diagram of a conventional multichip stacking package structure.
Figure 2:
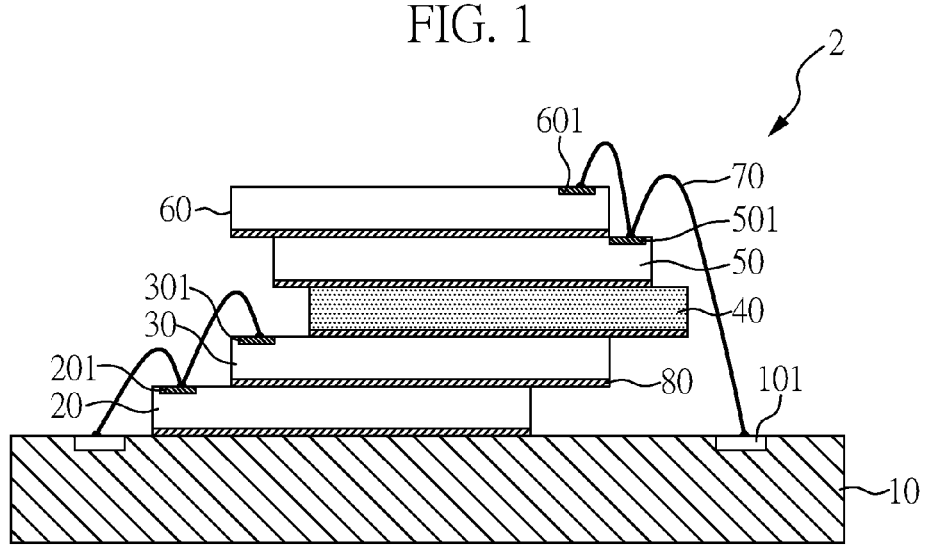
FIG. 2 shows a sectional schematic diagram of a multichip stacking package structure of the present invention.

Please refer to FIG. 2, FIG. 2 shows sectional schematic diagram of a multichip stacking package structure of the present invention. In the multichip stacking package structure 2 of the present invention, the multichip stacking package structure comprises a substrate 10 including a plurality of electrical connecting pads 101; a first chip 20 including an upper surface with a first chip pad 201 and a lower surface opposite to the upper surface, wherein the lower surface of the first chip 20 is stacked on the substrate 10 by a die adhesion layer; a second chip 30 including an upper surface with a second chip pad 301 and a lower surface opposite to the upper surface, wherein the lower surface of the second chip 30 is stacked on the upper surface of the first chip 20 by the interlaced reciprocation stacking way; a spacer 40 including an upper surface and a lower surface and stacking on the upper surface of the second chip 30 by the interlaced reciprocation stacking way; and a third chip 50 including an upper surface with a third chip pad 501 and a lower surface and stacking on the upper surface of the spacer 40 by the interlaced reciprocation stacking way, so that a first spacing is formed between an end of the third chip 50 and an end of the spacer 40. Further, the multichip stacking package structure 2 of the present invention further comprises a fourth chip 60 including an upper surface with a fourth chip pad 601 and a lower surface opposite to the upper surface, wherein the fourth chip 60 is stacked on the upper surface of the third chip 50 by the interlaced reciprocation stacking way. Moreover, these chips are bonded to each other, and the first chip to the substrate by a die adhesion layer 80 as illustrated by the same cross hatching for each layer. Besides, the end of the fourth chip 60 is set closely to the third chip pad 501 to provide an optimum support and avoid the chip crack of the chip pad 50. Furthermore, the electrical connecting pads 101 is electrically connected with the first chip pad 201, the second chip pad 301, the third chip pad 501 and the fourth chip 601 by the wires 70, and the chip pads are electrically connected to each other to input and output signals. Moreover, a second spacing is formed between an end of the fourth chip 60 and an end of the spacer 40, and a distance of the second spacing is twice as much as a distance of the first spacing.

Figure 3:
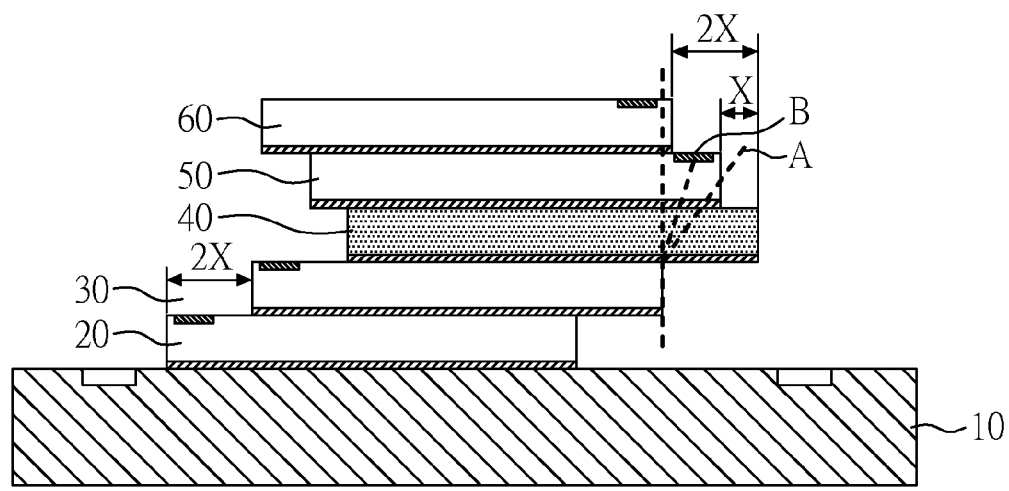
FIG. 3 shows a sectional schematic diagram of a stress point during wire bonding according to Example 1 of the present invention and a stress point according to prior art.

Please refer to FIG. 3, FIG. 3 shows a sectional schematic diagram of a stress point during wire bonding according to Example 1 of the present invention and an original stress point according to prior art. As shown in FIG. 3, a first spacing (X) is formed between an end of the third chip 50 and an end of the spacer 40, and a second spacing (2X) is formed between an end of the fourth chip 60 and an end of the spacer. Besides, the second spacing (2X) is formed between the end of the first chip 20 and the end of the second chip 30. In FIG. 3, comparing an original stress point A during wire bonding and a stress point B during wire bonding of the present invention, the stress point B of the present invention is closer to the third chip 50, but the original stress point A is farther away from the third chip 50. An optimum support is lacked below the original stress point A, so that the chips are cracked easily during wire bonding. Therefore, it is necessary to have a thicker chip to satisfy the stress during wire bonding, thereby avoiding the chip crack. However, the complexity of production will be increased during preparing materials in order to produce a thicker chip. Hence, on the premise of an ideal thickness, namely, the chips and the spacers have the same thickness, an optimum support can be provided by changing the position during wire bonding (such as the stress point B) and increasing the installation of the spacers, thereby avoid the damage of chips. Please refer to FIG. 3, the stress point A and the stress point B have the same supporting point; however, the positions of force point of the stress point A and the stress point B are different so as to cause the different force moment. It can be known from FIG. 3 that the stress point B has an optimum support, thereby avoid cracks of the third chips 50 during wire bonding.

Example 2

Figure 4:
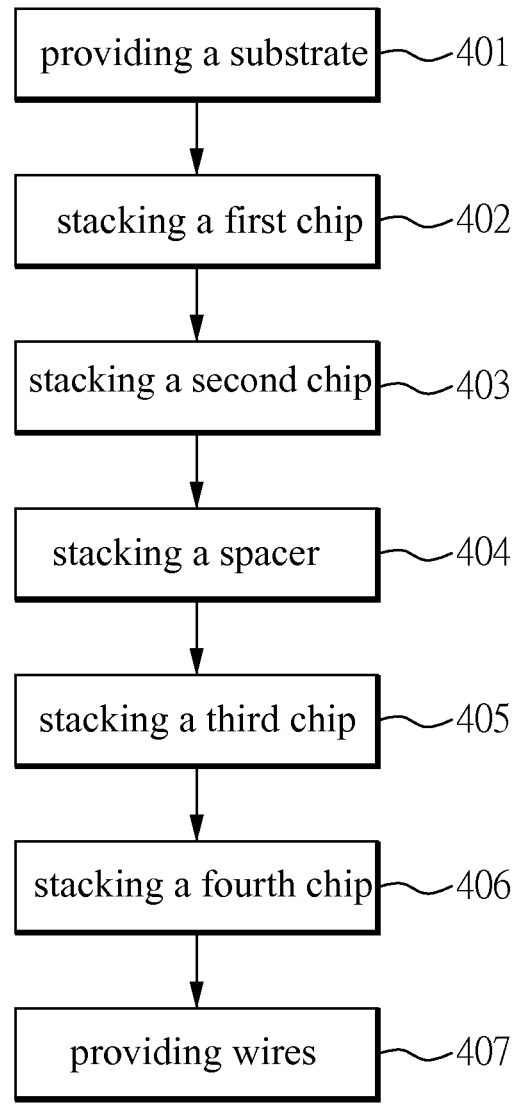
FIG. 4 shows a flow diagram of a method for manufacturing the multichip stacking package structure according to Example 2 of the present invention.

Please refer to FIG. 4, FIG. 4 shows a flow diagram of a method for manufacturing the multichip stacking package structure according to Example 2 of the present invention. First, as shown in step 401, a substrate is provided and the substrate has a plurality of electrical connecting pads. Second, as shown in step 402, a first chip is stacked on the substrate, wherein the first chip includes an upper surface with a first chip pad and a lower surface opposite to the upper surface, and the lower surface of the first chip is stacked on the substrate. Further, as shown in step 403, a second chip is stacked on the first chip, wherein the second chip has an upper surface with a second chip pad and a lower surface opposite to the upper surface, and the lower surface of the second chip is stacked on the upper surface of the first chip by the interlaced reciprocation stacking way. Moreover, as shown in step 404, a spacer is stacked on the second chip, wherein the spacer includes an upper surface and a lower surface opposite to the upper surface, and the spacer is stacked on the upper surface of the second chip by the interlaced reciprocation stacking way. Furthermore, as shown in step 405, a third chip is stacked on the spacer, wherein the third chip includes an upper surface with a third chip pad and a lower surface opposite to the upper surface, and the lower surface of the third chip pad is stacked on the upper surface of the spacer, so that a first spacing is formed between an end of the third chip pad and an end of the spacer. As shown in step 406, the fourth chip is stacked on the third chip, wherein the fourth chip includes an upper surface with a fourth chip pad and a lower surface, and the fourth chip is stacked on the upper surface of the third chip by the interlaced reciprocation stacking way. Further, the end of the fourth chip is set closely to the third chip pad to provide an optimum support, thereby avoiding cracks of the third chip. Between the step 401 and the step 402, the first chip is bonded on the substrate by a die adhesion layer. Between the steps 402, 403, 404, 405 and 406, the first chip, the second chip, the third chip and the fourth chip are bonded to each other by an adhesion layer. Finally, as shown in step 407, a plurality of wires are provided, so that the electrical connecting pads are electrically connected with the first chip pad, the second chip pad, the third chip pad and the fourth chip pad, and these chip pads are electrically connected to each other to input or output signals.

In the multichip stacking package structure of the present invention, an optimum support is provided by changing the position during wire bonding, and the spacer without wire bonding is provided to avoid damages of chips. Further, the chips with the same thickness are provided to simplify process of production and control the cost of production. In the present invention, a plurality of chips can be stacked and the chips with different functions are integrated into a single package structure. Therefore, the present invention cannot only reduce the overall size of the multichip but also enhances overall performance.

It should be understood that these examples are merely illustrative of the present invention and the scope of the invention should not be construed to be defined thereby, and the scope of the present invention will be limited only by the appended claims.

What is claimed is:

1. A multichip stacking package structure, comprising:
   a substrate including a plurality of electrical connecting pads;
   a first chip including an upper surface with a first chip pad and a lower surface opposite to the upper surface, wherein the lower surface of the first chip is stacked on the substrate;
   a second chip including an upper surface with a second chip pad and a lower surface opposite to the upper surface, wherein the lower surface of the second chip is stacked on the upper surface of the first chip by a interlaced reciprocation stacking way;
   a spacer including an upper surface and a lower surface opposite to the upper surface, and stacking on the second chip by the interlaced reciprocation stacking way; and
   a third chip including an upper surface with a third chip pad and a lower surface, wherein the lower surface of the third chip is stacked on the spacer, so that a first spacing is formed on the upper surface of the spacer between an end of the third chip where the third chip pad is disposed and an end of the spacer;

wherein the multichip stacking package structure further comprises a fourth chip including an upper surface with a fourth chip pad and a lower surface opposite to the upper surface, wherein the four chip is stacked on the upper surface of the third chip by the interlaced reciprocation stacking way;

wherein a second spacing is formed on the upper surfaces of the spacer and the third chip between an end of the fourth chip where the fourth chip pad is disposed and an end of the spacer, and a distance of the second spacing is twice as much as a distance of the first spacing.

2. The multichip stacking package structure of claim 1, wherein the end of the fourth chip is set closely to the third chip pad.

3. The multichip stacking package structure of claim 1, wherein the multichip stacking package structure further comprises a plurality of wires used to electrically connect with the first chip pad, the second chip pad, the third chip pad and the fourth chip pad; alternatively, these chip pads are electrically connected to each other by wires.

4. The multichip stacking package structure of claim 1, wherein the first chip, the second chip, the third chip and the fourth chip are bonded to each other by a die adhesion layer.

5. A method for manufacturing multichip stacking package structure, comprising:

providing a substrate having a plurality of electrical connecting pads;

stacking a first chip on the substrate, wherein the first chip includes an upper surface with a first chip pad and a lower surface opposite to the upper surface, and the lower surface of the first chip is stacked on the substrate;

stacking a second chip on the first chip, wherein the second chip includes an upper surface with a second chip pad and a lower surface opposite to the upper surface, and the lower surface of the second chip is stacked on the upper surface of the first chip by a interlaced reciprocation stacking way;

stacking a spacer on the second chip, wherein the spacer includes an upper surface and a lower surface, and is stacked on the second chip by the interlaced reciprocation stacking way; and stacking a third chip on the spacer, wherein the third chip includes an upper surface with a third chip pad and a lower surface opposite to the upper surface, and the lower surface of the third chip is stacked on the spacer, so that a first spacing is formed on the upper surface of the spacer between an end of the third chip where the third chip pad is disposed and an end of the spacer;

wherein the method further comprises a step of stacking a fourth chip including an upper surface with a fourth chip pad and a lower surface opposite to the upper surface on the third chip, and the fourth chip is stacked on the upper surface of the third chip by the interlaced reciprocation stacking way;

wherein a second spacing is formed on the upper surfaces of the spacer and the third chip between an end of the fourth chip where the fourth chip pad is disposed and an end of the spacer, and a distance of the second spacing is twice as much as a distance of the first spacing.

6. The method for manufacturing multichip stacking package structure of claim 5, wherein the end of the fourth chip is set closely to the third chip pad.

7. The method for manufacturing multichip stacking package structure of claim 5, wherein the method further comprises a step of forming a plurality of wires electrically connected with the first chip pad, the second chip pad, the third chip pad and the fourth chip pad; alternatively, these chip pads are connected to each other by wires.

8. The method for manufacturing multichip stacking package structure of claim 5, wherein the first chip, the second chip, the third chip and the fourth chip are boned to each other by an adhesion layer.

9. The method for manufacturing multichip stacking package structure of claim 5, wherein the lower surface of the first chip is bonded on the substrate by a die adhesion layer.

* * * * *